(12) United States Patent
Weigand

(10) Patent No.: US 6,489,856 B1
(45) Date of Patent: Dec. 3, 2002

(54) DIGITAL ATTENUATOR WITH COMBINED BITS

(75) Inventor: Christopher D. Weigand, Woburn, MA (US)

(73) Assignee: Tyco Electronics Corporation, Middleton, PA (US)

( * ) Notice: Subject to any disclaimer, the term of this patent is extended or adjusted under 35 U.S.C. 154(b) by 3 days.

(21) Appl. No.: 09/953,995

(22) Filed: Sep. 17, 2001

(51) Int. Cl.[7] .................................................. H01P 1/22
(52) U.S. Cl. ......................... 333/81 R; 326/32; 327/308
(58) Field of Search ........................ 333/81 R; 327/308; 326/32

(56) References Cited

U.S. PATENT DOCUMENTS

| | | | | |
|---|---|---|---|---|
| 4,978,932 A | * | 12/1990 | Gupta et al. ................. 327/313 |
| 5,148,062 A | * | 9/1992 | Goldfarb ...................... 327/237 |
| 5,281,928 A | * | 1/1994 | Ravid et al. ................. 327/308 |
| 5,440,280 A | * | 8/1995 | Lord ............................ 327/308 |
| 5,656,978 A | * | 8/1997 | Bianu et al. ................. 666/81 A |
| 5,796,286 A | * | 8/1998 | Otaka .......................... 327/307 |
| 5,825,227 A | * | 10/1998 | Kohama et al. ............. 327/308 |
| 5,912,599 A | * | 6/1999 | Beall ............................ 327/308 |
| 6,300,814 B1 | * | 10/2001 | Takahashi .................... 327/308 |

* cited by examiner

Primary Examiner—Michael Tokar
Assistant Examiner—Khai Nguyen

(57) ABSTRACT

A multiple-bit digital attenuator with improved frequency response and reduced insertion loss characteristics is provided. The multiple-bit digital attenuator comprises at least one 2-bit digital attenuator. The 2-bit digital attenuator includes a single series switching transistor located between a first terminal and a second terminal and controllable by a reference control signal, a temperature compensation circuit placed in parallel with the series switching transistor and including two temperature compensation transistors, a pair of first shunt circuits located at the first and second terminals and controllable by a first bit control signal, and a second shunt circuit located between the two temperature compensation transistors and controllable by a second bit control signal.

23 Claims, 3 Drawing Sheets under the US 6,489,856 B1

DIGITAL ATTENUATOR WITH COMBINED BITS

FIELD OF THE INVENTION

The present invention relates to digital attenuators and, more particularly, to a digital attenuator having reduced reference insertion loss and improved high frequency response.

BACKGROUND OF THE INVENTION

Present day electronic devices often incorporate controllable attenuator devices and/or components for varying the amount of resistance applied to electronic signals passing therethrough. Such attenuators are used in, among other things, automatic gain control circuits, position locating systems, telephone systems, television systems, and microwave circuit applications.

Electronically controllable solid state attenuators for use at microwave frequencies sometimes employ PIN diodes arranged in a variety of network configurations. Circuitry for providing controlled bias to the diodes is generally used in such devices to cause the diode network to generate the desired magnitude of signal resistance. Such PIN diode-based attenuators are capable of outstanding high-frequency performance, but consume an undesirably large amount of electrical power, and additionally, are not easily integrated into monolithic microwave-application circuitry.

Other devices for providing setectable attenuation incorporate high frequency field effect transistors (FETs), such as, e.g., gallium arsenide metal semiconductor FETs, arranged in a vaiety of network configurations (which may include other circuit elements, e.g., discrete resistor, among others). These devices operate by applying control sins to the gates of the transistors to adjust or select the overall attenuation level of the device.

Digital attenuators vary the strength of input signals in response to digital control signals. In a typical 1-bit digital attenuator, the amount of attenuation offered by the attenuator varies depending on whether the bit of the control signal has a value of "0" or "1". Typically, if a 2-bit or other multiple-bit digital attenuator is desired, a plurality of 1-bit digital attenuators are cascaded according to known techniques to produce the desired m-bit digital attenuator (where m≧2). For example, if a 3-bit digital attenuator is desired, three of the 1-bit digital attenuators are cascaded to produce the 3-bit digital attenuator.

Due to the cascading of bits, however, a reference insertion loss in conventional multi-bit digital attenuators tends to be high A reference insertion loss represents an amount of attenuation provided by the attenuator when the attenuator is switched off. A high reference insertion loss can interfere with the performance of the system in which the attenuator is installed. In addition, a high reference insertion loss tends to lead to a higher Voltage Standing Wave Ratio (VSWR), which represents the amount of reflected power. A high VSWR increases noise, which degrades the performance of the assembly that uses the digital attenuator. Further, having multiple bits that are cascaded in the digital attenuator deteriorates the attenuation accuracy when multiple bits are switched on at the same time.

To overcome these problems, an improved digital attenuator that minimizes the reference insertion loss has been proposed in U.S. Provisional Application No. 60/210,139, filed on Jun. 2, 2000, and entitled "Scalable N×M, RF Switching Matrix Architecture", which is herein fully incorporated by reference. The digital attenuator described in U.S. Provisional Application No. 60/210,139 includes a single series switching FET for effectively and significantly lowering the reference insertion loss. However, due to the single series FET topology, this attenuator may be more conducive to operating at low frequencies than at high frequencies.

On the other hand, U.S. Pat. No. 5,281,928 issued to Rabid et al., which is herein fully incorporated by reference, discloses a 1-bit digital attenuator 30 which is illustrated in FIG. 1. As shown in FIG. 1, the 1-bit digital attenuator 30 includes a series switching Field Effect Transistor (FET) Q1 controllable by a bit 1 control signal A applied at a first control node 12, a temperature compensating FET Q2 in parallel with the series switching FET Q1, and a pair of shunt switching FETs Q3 and Q4 controllable by the complement of the bit 1 control signal A (herein termed bit 1 control signal B) applied at a second control node 14. By applying different control signals at the control nodes 12 and 14 and thereby selectively switching on and off the appropriate FETs Q1–Q4, an input signal such as a Radio Frequency (RF) signal applied at an input node 10 can be attenuated appropriately to generate an attenuated signal at an output node 20. Specifically, when bit 1 control signal A at node 12 is at logic high and bit 1 control signal B at node 14 is at logic low, transistor Q1 is turned on and transistors Q3 and Q4 are turned off. Thus, the input signal is passed through from input terminal 10 to output terminal 20 essentially through transistor Q1, thus incurring only the reference insertion loss. However, when bit 1 control signal A at node 12 is at logic low and bit 1 control signal B at node 14 is at logic high, transistor Q1 is turned off and transistors Q3 and Q4 are turned on. In this case, the input signal at node 10 is acted upon by the two shunt circuits comprising transistor Q3 and resistor R3 and transistor Q4 and resistor R4, respectively, thus incurring attenuation in addition to the reference insertion loss.

Although the structure of the digital attenuator 30 provides improved performance at high frequencies, this structure increases the reference insertion loss essentially linearly as these attenuators are cascaded to produce a multi-bit digital attenuator. That is, a two bit digital attenuator comprising two circuits 30 will have approximately twice the reference insertion loss and a three bit digital attenuator comprising three cascaded circuits 30 will have approximately three times the reference insertion loss.

Accordingly, a need exists for a multi-bit digital attenuator with improved high frequency response and reduced reference insertion loss.

SUMMARY OF THE INVENTION

The present invention provides a multiple-bit digital attenuator with improved high frequency response and reduced reference insertion loss which overcomes limitations associated with conventional digital attenuators. Particularly, the multiple-bit digital attenuator of the present invention provides an additional shunt circuit in the middle of a temperature compensation circuit. This allows bits to be combined while still using a single series FET, so that the high frequency response can be maintained while reducing the reference insertion loss of the multiple-bit digital attenuator.

According to one embodiment, the present invention is directed to a multiple-bit digital attenuator for attenuating a signal, comprising at least one 2-bit digital attenuator. The 2-bit digital attenuator comprises a single series switching transistor located between a first terminal and a second terminal and controllable by a reference control signal, a temperature compensation circuit in parallel with the series switching transistor and including two temperature compensation transistors, a pair of first shunt circuits at the first and second terminals and controllable by a first bit control signal, and a second shunt circuit located between the two temperature compensation transistors and controllable by a second bit control signal.

In another embodiment, the present invention is directed to a method of providing a multiple-bit attenuator for attenuating a signal, comprising the steps of: providing at least one 2-bit digital attenuator including a single series switching transistor located between a first terminal and a second terminal and controllable by a reference control signal, a temperature compensation circuit in parallel with the series switching transistor and including two temperature compensation transistors, and a pair of first shunt circuits at the first and second terminals and controllable by a first bit control signal; and providing a second shunt circuit located between the two temperature compensation transistors and controllable by a second bit control signal.

BRIEF DESCRIPTION OF THE DRAWINGS

In the drawings, the same reference numerals are used to indicate the same elements.

DETAILED DESCRIPTION OF THE PREFERRED EMBODIMENTS

Figure 2:
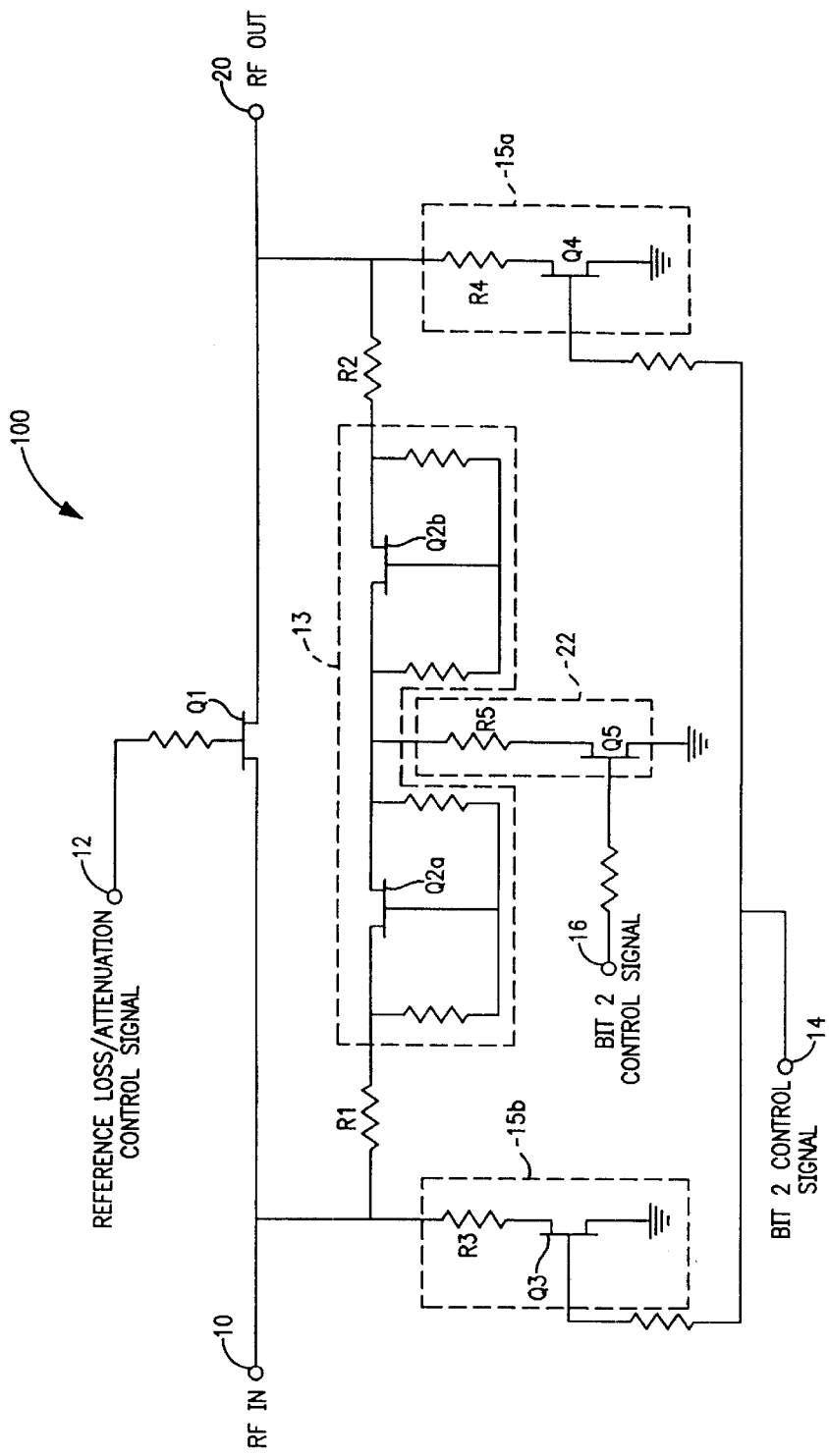
FIG. 2 is a schematic circuit diagram of a multiple-bit digital attenuator according to one embodiment of the present invention.

FIG. 2 is a schematic circuit diagram of a multiple-bit digital attenuator 100 according to one embodiment of the present invention. In this example, the digital attenuator 100 is a 2-bit digital attenuator. As shown in FIG. 2, the 2-bit digital attenuator 100 includes a series switching FET Q1 between an input terminal 10 and an output terminal 20, a temperature compensation circuit 13 in parallel with the series switching FET Q1 and including a pair of temperature compensating FETs Q2a and Q2b, a pair of first shunt circuits 15a and 15b connected between the input and output terminals 10 and 20, respectively and ground, and a second shunt circuit 22 placed between the temperature compensation FETs Q2a and Q2b.

The series switching FET Q1 is controllable by a reference control signal applied at a first control node 12. The temperature compensation circuit 13 also includes resistors R1 and R2 placed in parallel with the series switching FET Q1 between the input and output terminals 10 and 20. Each of the first shunt circuits 15a and 15b includes a shunt switching FET Q3 and Q4, respectively, in series with at least one resistor R3 and R4, respectively. The shunt switching FETs Q3 and Q4 are controllable by a bit 1 control signal applied at a second control node 14. The first shunt circuit 15a extends from the input terminal 10 to ground. The second shunt circuit 15b extends from the output terminal 20 to ground.

The second shunt circuit 22 includes a series switching FET Q5 in series with a resistor R5, and is located between the pair of temperature compensation FETs Q2a and Q2b. The series switching FET Q5 is controllable by a bit 2 control signal applied at a third control node 16.

The operation of the digital attenuator 100 is as follows. There are four operational states in which the digital attenuator 100 can operate: reference loss state, bit-1-on state, bit-2-on state, and bits 1&2-on state. By varying the level (e.g., between "0" and "1" levels) of control signals applied at the nodes 12, 14 and 16, the attenuator 100 operates in one of these four states. For instance, in the first, reference loss, state, a high level control signal is applied at the first node 12 to turn on the FET Q1, and low level control signals are applied at the second and third nodes 14 and 16 to turn off the FETs Q3, Q4 and Q5. This turns off both attenuator bits. It should be noted that the temperature compensation FETs Q2a and Q2b are always turned on regardless of the state of the attenuator 100.

In the second state, the bit 1 control signal is turned on (logic high at node 14) and low level control signals are applied to the first and third nodes 12 and 16 to turn off the FETs Q1 and Q5. The logic high level control signal applied at the second node 14 turns on the FETs Q3 and Q4. The shunt arms with the FETs Q3 and Q4 form a pi (a) attenuator pad in conjunction with the series temperature compensating path to provide a bit-1 attenuation.

In the third state, where the bit 2 control signal is tuned on (logic high at node 16), low level control signals are applied at the fist and second nodes 12 and 14 to turn off the FETs Q1, Q3 and Q4, whereas a high level control signal is applied to the third node 16 to turn on the PET Q5. The resistor R1 and the FET Q5 provide a predeteried bit-2 attenuation relative to the refrence loss state.

The fourth state is where both bits 1 and 2 are turned on (logic high at nodes 14 and 16). In the fourth state, a low level control signal is applied at the first node 12 to turn off the FET Q1. At the same time, high level control signals applied to the second and third nodes 14 and 16 turn on the FETs Q3, Q4 and Q5. This provides an attenuation amount equaling a sum of the bit-1 attenuation offered in the second state and the bit-2 attenuation offered in the third state. One skilled in the art will readily understand and appreciate the above-described operation of the circuit in FIG. 2 in view of the circuit connections. One skilled in the art would also appreciate that any appropriate resistance values for the resistors of the digital attenuator 100 can be used to set the attenuation corresponding to the bits. The values of the gate resistors are not critical to the attenuation accuracy of the frequency response.

Figure 1:
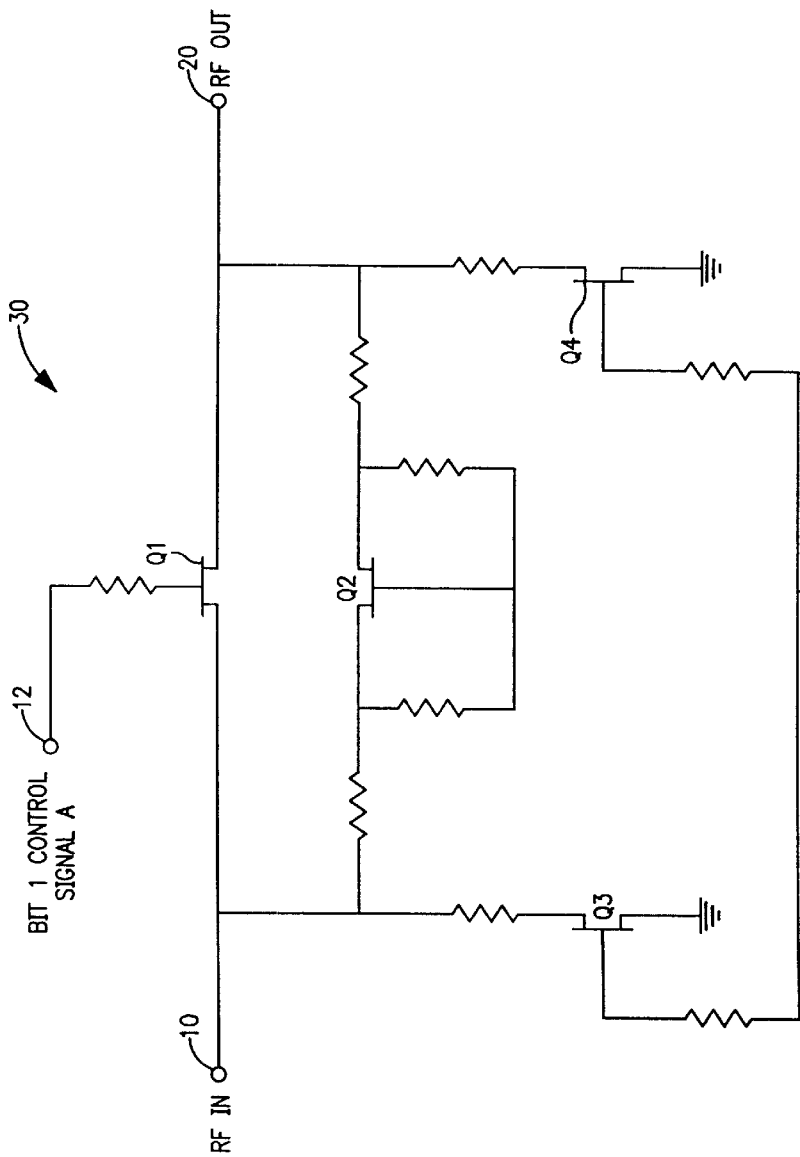
FIG. 1 is a schematic circuit diagram of a conventional 1-bit digital attenuator.

According to the present invention, the reference insertion loss of the 2-bit digital attenuator 100 is reduced relative to a 2-bit attenuator constructed in accordance with the principles of the prior art as shown in FIG. 1 because the circuit of FIG. 2 includes two attenuator bits and a single series FET for the two bits. This distributes the reference insertion loss between the two attenuator bits, thereby reducing the reference insertion loss per attenuator bit. In comparison, a conventional two-bit attenuator formed by cascading two of the one-bit attenuator shown in FIG. 1 would include two series FETs. In this respect, the reference insertion loss of the conventional two-bit attenuator would be almost twice the reference insertion loss of the 2-bit attenuator 100 of the present invention, assuming that the FET sizes are the same.

Furthermore, the high frequency response of the attenuator 100 is improved relative to the circuit disclosed in aforementioned provisional application Ser. No. 60/210,139 because there is one series switching transistor for every 2-bit attenuator. In the attenuator disclosed in the provisional application, there is only one series switching transistor regardless of the number of bits of the attenuator. Accordingly, in the present invention, as the number of bits of the attenuator increases, the parasitic capacitance decreases because the number of switching capacitors in series increases, which is not the case in the attenuator of the provisional application.

In addition, by reducing the number of elements (e.g., FETs) in the present invention, the present invention reduces the overall size and cost of multiple-bit digital attenuators.

Figure 3:
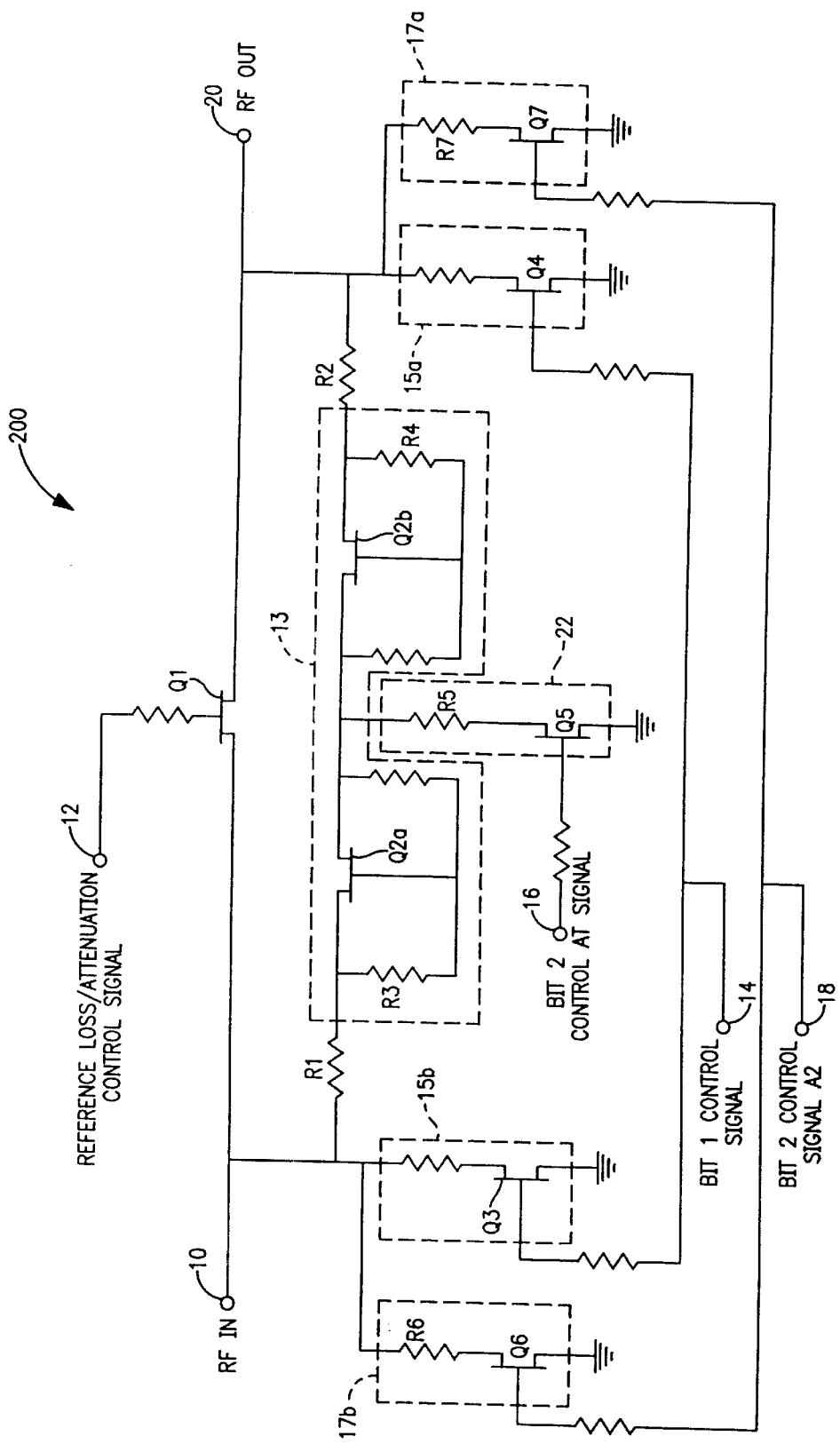
FIG. 3 is a schematic circuit diagram of a multiple-bit digital attenuator according to another embodiment of the present invention.

FIG. 3 is a schematic circuit diagram of a digital attenuator 200 according to another embodiment of the present invention. As shown in FIG. 3, the digital attenuator 200 of the present invention includes the structure of the 2-bit attenuator 100 shown in FIG. 2 and additionally a pair of shunt switching circuits 17a and 17b in parallel with the shunt switching circuits 15a and 15b. Each shunt switching circuit 17a, 17b includes a shunt switching FET Q6 or Q7 and a resistor R6 or R7. The shunt switching FETs Q6 and Q7 are controllable by a bit 2 control signal A2 applied at a fourth control node 18.

These shunt switching circuits 17a and 17b allow fine tuning of the digital attenuator 200, if needed, according to known techniques.

One skilled in the art would readily understand that the concepts and the structures shown in FIGS. 2 and 3 can be used to provide n-bit digital attenuators where n≧3 using known cascading techniques. For example, if a 3-bit digital attenuator is desired, a 1-bit attenuator such as the one shown in FIG. 1 is placed in series with the 2-bit attenuator 100 or 200 of FIG. 2 or 3 of the present invention to produce a 3-bit digital attenuator. If a 4-bit digital attenuator is desired, two of the 2-bit digital attenuators 100 of FIG. 2 or 200 of FIG. 3 can be placed in series with each other to produce a 4-bit digital attenuator. Regardless of how many bits are combined, these multiple-bit digital attenuators of the present invention will have improved high frequency responses and reduced reference insertion loss compared to prior art multiple-bit digital attenuators.

Although MESFETs can be used in the digital attenuators of the present invention, the invention is not limited to using MESFETs only, but encompasses digital attenuators using other types of transistors such as PHEMTs or BJTs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multiple-bit digital attenuator for attenuating a signal, comprising:
   a first transistor located between a first terminal and a second terminal and controllable by a reference control signal,
   a temperature compensation circuit in parallel with the first transistor and including second and third transistors in series with each other,
   a pair of first shunt circuits connected to the first and second terminals, respectively, and controllable by a first bit control signal, and
   a second shunt circuit connected between the second and third transistors and controllable by a second bit control signal.

2. The multiple-bit digital attenuator of claim 1, wherein each shunt circuit includes a resistor and a transistor connected in series with each other.

3. The multiple-bit digital attenuator of claim 2 wherein the first bit control signal controls the transistors of the first pair of shunt circuits.

4. The multiple-bit digital attenuator of claim 3 wherein the transistors of the first pair of shunt control circuits have a control terminal connected to the first bit control signal and the transistor of the second shunt circuit has a control terminal connected to the second bit control signal.

5. The multiple-bit digital attenuator of claim 2 wherein the temperature compensation circuit further comprises two resistors connected in series with the second and third transistors.

6. A multiple-bit digital attenuator comprising:
   at least one 1-bit digital attenuator connected in series with the multiple-bit attenuator of claim 2.

7. A multiple-bit digital attenuator comprising a plurality of said multiple-bit attenuators of claim 2 connected in series with each other.

8. The multiple-bit digital attenuator of claim 2 further comprising:
   a pair of third shunt circuits in parallel with the pair of first shunt circuits, said pair of third shunt circuits being controllable by a third control signal.

9. The multiple-bit digital attenuator of claim 2, wherein the first and second terminals are respectively input and output terminals for receiving and outputting RF (radio frequency) signals, respectively.

10. The multiple-bit digital attenuator of claim 2, wherein the first, second and third transistors are field effect transistors (FETs).

11. The multiple-bit digital attenuator of claim 4, wherein one of the first shunt circuits extends from the first terminal to ground, and the other one of the first shunt circuits extends from the second terminal to ground.

12. The multiple-bit digital attenuator of claim 9, wherein the second shunt circuit extends from between the second and third transistors to ground.

13. A method of providing a multiple-bit digital attenuator for attenuating a signal, the method comprising the steps of:
   providing a first transistor located between a first terminal and a second terminal and controllable by a reference control signal;
   providing a temperature compensation circuit in parallel with the first transistor and including second and third transistors in series with each other;
   providing a pair of first shunt chits connected to the first and second terminals, respectively and controllable by a first bit control signal; and
   providing a second shunt circuit connected between the second and third transistors and controllable by a second bit control signal.

14. The method of claim 13, wherein each shunt circuit includes a resistor and a transistor connected in series with each other.

15. The method of claim 14 wherein the first bit control signal controls the transistors of the first pair of shunt circuits.

16. The method of claim 14 wherein the temperature compensation circuit further comprises two resistors connected in series with the second and third transistors.

17. A method of providing a multiple-bit digital attenuator comprising the step of:
   providing at least one 1-bit digital attenuator placed in series with the multiple-bit digital attenuator of claim 14.

18. A method of providing a multiple-bit digital attenuator comprising the step of providing a plurality of said multiple-bit digital attenuators of claim 14 connected in series with each other.

19. The method of claim 14, further comprising the step of:
providing a pair of third shunt circuits in parallel with the pair of first shunt circuits, said pair of third shunt circuits being controllable by a third control signal.

20. The method of claim 14, wherein the first and second terminals are respectively input and output terminals for receiving and outputting RF (radio frequency) signals.

21. The method of claim 14, wherein the first, second and third transistors are field effect transistors (FETs).

22. The method of claim 14, wherein one of the first shunt circuits extends from the first terminal to ground, and the other one of the first shunt circuits extends from the second terminal to ground.

23. The method of claim 22, wherein the second shunt circuit extends from between the second and third transistors to ground.

* * * * *